United States Patent
Chou

(10) Patent No.: US 9,053,758 B2
(45) Date of Patent: Jun. 9, 2015

(54) READING METHOD OF MEMORY

(75) Inventor: Tsung-Yi Chou, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 395 days.

(21) Appl. No.: 13/540,715

(22) Filed: Jul. 3, 2012

(65) Prior Publication Data

US 2014/0010028 A1   Jan. 9, 2014

(51) Int. Cl.
   G11C 7/00   (2006.01)
   G11C 7/06   (2006.01)
   G11C 7/14   (2006.01)

(52) U.S. Cl.
   CPC ... *G11C 7/06* (2013.01); *G11C 7/14* (2013.01)

(58) Field of Classification Search
   CPC .............. G11C 14/3431; G11C 16/26; G11C 14/3422; G11C 14/3427
   USPC .............................. 365/196, 185.21, 205, 207
   See application file for complete search history.

(56) References Cited

U.S. PATENT DOCUMENTS

| 7,423,912 B2* | 9/2008 | Perlegos et al. .......... 365/185.24 |
| 2007/0014160 A1* | 1/2007 | Kobernik et al. ........ 365/185.23 |
| 2008/0181012 A1* | 7/2008 | Richter et al. ........... 365/185.21 |
| 2008/0239812 A1* | 10/2008 | Abiko et al. ............. 365/185.12 |

* cited by examiner

*Primary Examiner* — Han Yang
(74) *Attorney, Agent, or Firm* — McClure, Qualey & Rodack, LLP

(57) ABSTRACT

A reading method of a memory is provided. The memory has a turn on window. The reading method comprises the following steps. A reading voltage is provided. The reading voltage is shown if the reading voltage is located in the turn on window. The reading voltage is updated by moving a predetermined distance if the reading voltage is not located in the turn on window. The predetermined distance is cut by half before the step of updating the reading voltage is performed again.

20 Claims, 2 Drawing Sheets

READING METHOD OF MEMORY

BACKGROUND

1. Technical Field

The disclosure relates in general to a reading method, and more particularly to a reading method of a memory.

2. Description of the Related Art

With the development of semiconductor technology, varied semiconductor elements are invented. Those semiconductor elements are widely used in electric devices.

For example, semiconductor memory is an electronic data storage device, often used as computer memory, implemented on a semiconductor-based integrated circuit. Semiconductor memory includes non-volatile memory such as read-only memory (ROM), magnetoresistive random-access memory (MRAM), flash memory, static random-access memory (SRAM), and dynamic random-access memory (DRAM).

Due to the fine distinction between varied memories, reading voltages of the memories may be different with each other. Therefore, for each memory, it is needed to test and verify the reading voltage of each memory.

SUMMARY

The disclosure is directed to a reading method of a memory. An updating step is used for updating the reading voltage to be located in a turn on window.

According to a first aspect of the present disclosure, a reading method of a memory is provided. The memory has a turn on window. The reading method comprises the following steps. A reading voltage is provided. The reading voltage is shown if the reading voltage is located in the turn on window. The reading voltage is updated by moving a predetermined distance if the reading voltage is not located in the turn on window. The predetermined distance is cut by half before the step of updating the reading voltage is performed again.

According to a second aspect of the present disclosure, a reading method of a memory is provided. The memory has a turn on window. The reading method comprises the following steps. A reading voltage is provided. The reading voltage is shown if the reading voltage is located in the turn on window. The reading voltage is updated by moving a predetermined distance if the reading voltage is not located in the turn on window. The predetermined distance is changed before the step of updating the reading voltage is performed again.

The above and other aspects of the disclosure will become better understood with regard to the following detailed description of the non-limiting embodiments. The following description is made with reference to the accompanying drawings.

DETAILED DESCRIPTION

Several embodiments are disclosed below for elaborating the invention. The following embodiments are for the purpose of elaboration only, not for limiting the scope of protection of the invention. Besides, secondary elements are omitted in the following embodiments to highlight the technical features of the invention.

Figure 1:
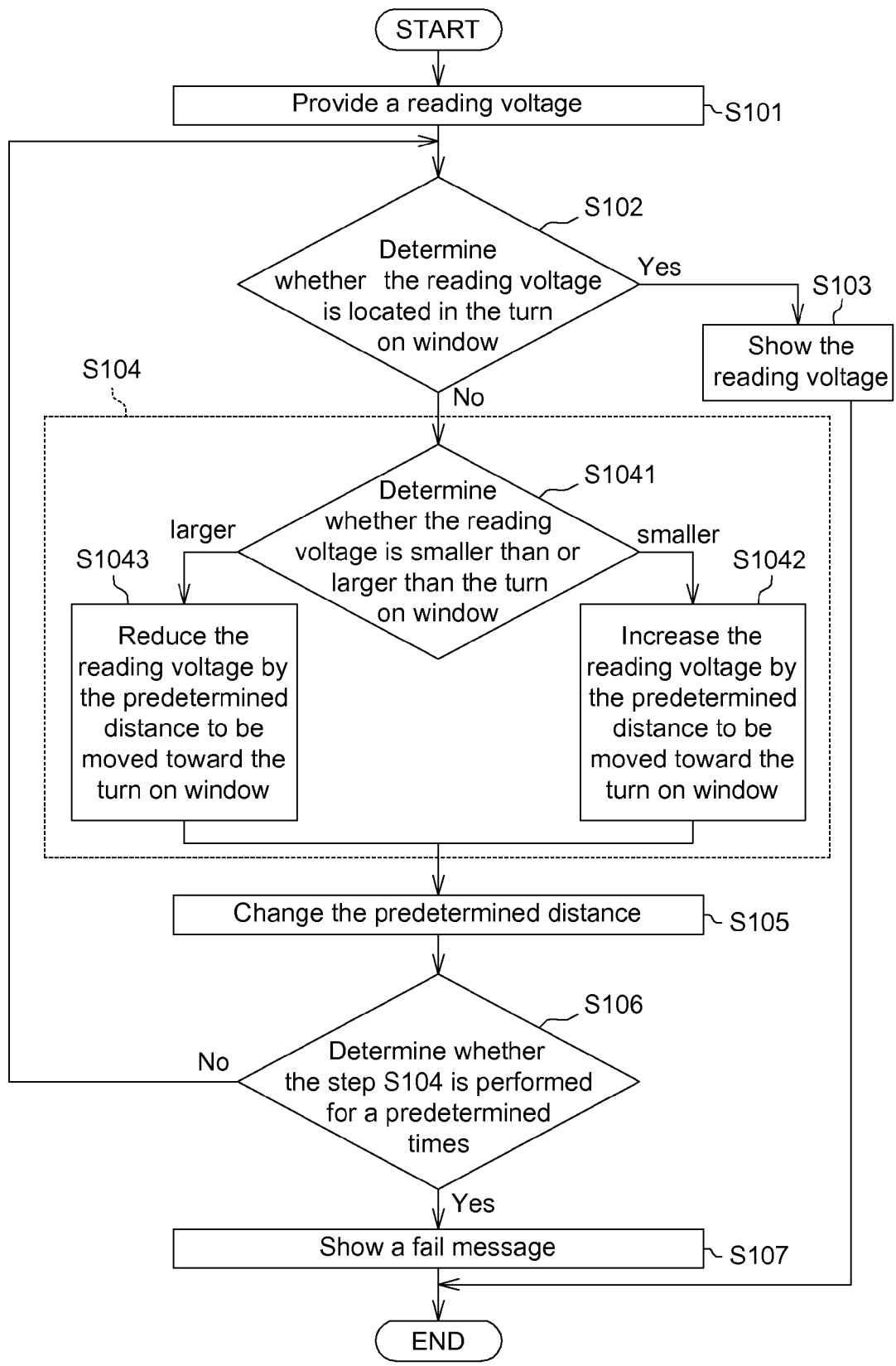
FIG. 1 shows a flowchart of a reading method of a memory.
Figure 2:
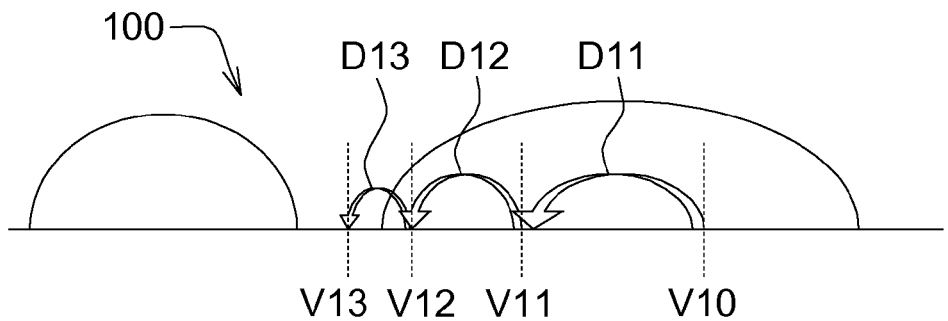
FIG. 2 shows an example of FIG. 1.

Referring to FIGS. 1 and 2, FIG. 1 shows a flowchart of a reading method of a memory, and FIG. 2 shows an example for FIG. 1. The memory has a turn on window 100. In a reading process, a reading voltage must be located in the turn on window 100. If the reading voltage is not located in the turn on window 100, the memory cannot be read accurately. In FIG. 1, the reading voltage can be updated to be located in the turn on windows 100 quickly.

Firstly, please referring to step S101, a reading voltage is provided. The reading voltage can be set by random or be set according to an experience value.

Afterwards, please referring to S102, whether the reading voltage is located in the turn on window 100 is determined. If the reading voltage is located in the turn on window 100, then the process is processed to step S103; if the reading voltage is not located in the turn on window 100, then the process is processed to step S104.

In step S103, the reading voltage is shown and the process is terminated. The memory can be read at the reading voltage which is located in the turn on window 100.

In step S104, the reading voltage is updated by moving a predetermined distance if the reading voltage is not located in the turn on window 100. The step S104 includes steps S1041, S1042 and S1043. In step S1041, whether the reading voltage is smaller than or larger than the turn on window 100 is determined. If the reading voltage is smaller than the turn on window 100, then the process is proceed to step S1042; if the reading voltage is larger than the turn on window 100, then the process is proceed to step S1043.

In step S1042, the reading voltage is increased by the predetermined distance to be moved toward the turn on window 100. In step S1043, the reading voltage is reduced by the predetermined distance to be moved toward the turn on window 100.

For example, please referring to FIG. 2, a reading voltage V10 is not located in the turn on window 100, and then the reading voltage V10 is reduced to be a reading voltage V11 by moving a predetermined distance D11 which is 200 millivolts (mV).

Next, please referring to step S105, the predetermined distance is changed before the step S104 of updating the reading voltage is performed again. In one embodiment, the predetermined distance can be changed to be small gradually. For example, the predetermined distance can be changed to be small linearly (or randomly). In one embodiment, the predetermined distance can be changed to be large gradually. For example, the predetermined distance can be changed to be large linearly (or randomly). In one embodiment, the predetermined distance can be changed to be small or to be large randomly. For example, the predetermined distance can be changed to be small in one circle, and then the predetermined distance can be changed to be large in next circle. In the present embodiment, the predetermined distance is cut by half before the step S104 of updating the reading voltage is performed again. For example, please referring to FIG. 1, the predetermined distance D11 is cut by half to be a predetermined distance D12, which is 100 mV.

Afterwards, please referring to step S106, whether the step S104 is performed for a predetermined times is determined. If the step S104 is performed for the predetermined times, then the process is proceeded to S107; if the step S104 is not performed for the predetermined times, then the process is proceeded to step S102.

In step S107, a fail message is shown and the process is terminated. That is to say, after the reading voltage is updated for the predetermined times, if the reading voltage is still not located in the turn on window 100, then the fail message is shown and the process is terminated.

For example, please referring to FIG. 2, the predetermined times are 3 times. In the first circle, the reading voltage V10 is moved by the predetermined distance D11, which is 200 mV, to be the reading voltage V11. The reading voltage V11 is not located in the turn on window 100, so the process is proceed to next circle. In the second circle, the reading voltage V11 is moved by a predetermined distance D12, which is 100 mV, to be a reading voltage V12. The reading voltage V12 is still not located in the turn on window 100, so the process is proceed to next circle. In the third circle, the reading voltage V12 is moved by a predetermined distance D13, which is 50 mV, to be a reading voltage V13. The reading voltage V13 is located in the turn on window 100, so the reading voltage V13 is shown and the process is terminated.

In the example shown in FIG. 2, the reading voltage V10 is moved by 350 mV to be the reading voltage V13 with three circles only. At beginning, the distance between the reading voltage V10 and the turn on window 100 is large, so the predetermined distance D11 in the first circle is large accordingly. After several circles, the distance between the regarding voltage V12 and the turn on window 100 becomes small, so the predetermined distance D13 in the third circle is small accordingly. Therefore, the reading voltage V10 can be updated to be located in the turn on windows 100 quickly.

Figure 3:
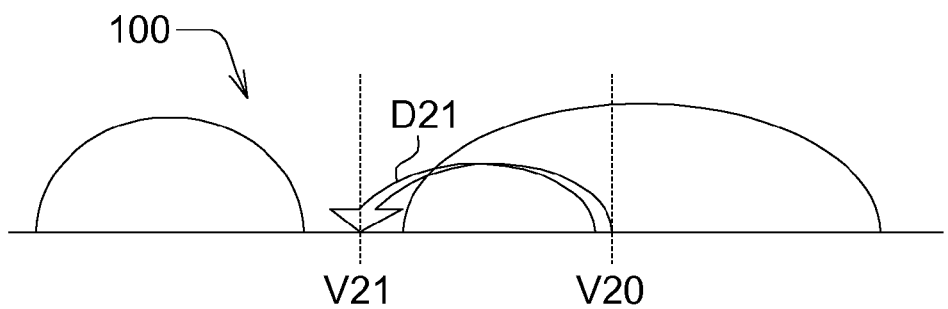
FIG. 3 shows another example of the reading method of the memory of FIG. 1.

Please refer to FIG. 3, which shows another example of the reading method of the memory of FIG. 1. At beginning, the reading voltage V20 is not located in the turn on window 100. The reading voltage V20 is larger than the turn on window 100, thus the reading voltage V20 is reduced by the predetermined distance D21 to be a reading voltage V21. The reading voltage V21 is located in the turn on window 100, so that the process is terminated. In this example, even if the reading voltage V20 is far from the turn on window 100, the reading voltage V20 still can be updated to be located in the turn on window 100 in one circle.

Figure 4:
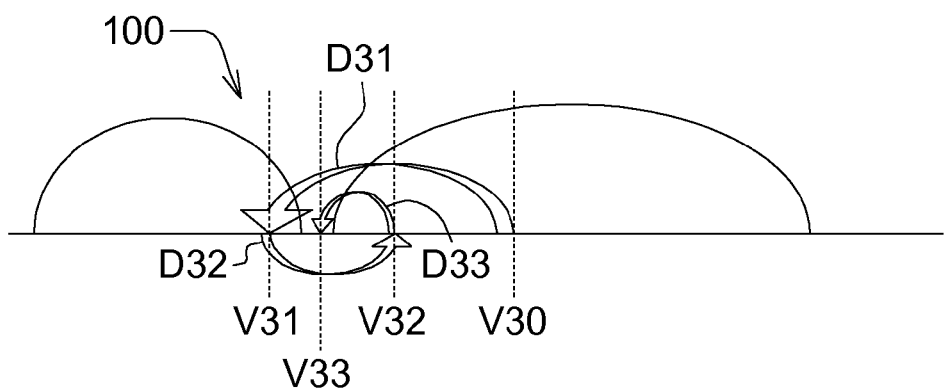
FIG. 4 shows another example of the reading method of the memory of FIG. 1.

Please refer to FIG. 4, which shows another example of the reading method of the memory of FIG. 1. At beginning, the reading voltage V30 is not located in the turn on window 100. The reading voltage V30 is larger than the turn on window 100, thus the reading voltage V30 is reduced by a predetermined distance D31 to be a reading voltage V31. The reading voltage V31 is still not located in the turn on window 100, and the reading voltage V31 is smaller than the turn on window 100. Then, the reading voltage V31 is increased by a predetermined distance D32 to be a reading voltage V32. The reading voltage V32 is still not located in the turn on window 100, and the reading voltage V32 is larger than the turn on window 100. Then, the reading voltage V32 is reduced by a predetermined distance D33 to be a reading voltage V33. The reading voltage V33 is located in the turn on window 100, so that the process is terminated. In this example, even if the reading voltage V30 is not located in the turn on window 100, the reading voltage V30 still can be updated to be located in the turn on window 100 by increasing or reducing the predetermined distance D31, D32, D33.

In one embodiment, the predetermined distance can be changed linearly. For example, the predetermined distance can be 200 mV at beginning. Next, the predetermined distance can be changed to 150 mV. Afterwards, the predetermined distance can be changed to 100 mV. Then, the predetermined distance can be changed to 50 mV.

While the disclosure has been described by way of example and in terms of the exemplary embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A reading method of a memory, wherein the memory has a turn on window, and the reading method comprises:
    providing a reading voltage;
    showing the reading voltage if the reading voltage is located in the turn on window;
    updating the reading voltage by moving a predetermined distance if the reading voltage is not located in the turn on window; and
    cutting the predetermined distance by half before the step of updating the reading voltage is performed again.

2. The reading method of the memory according to claim 1, wherein in the step of updating the reading voltage by moving a predetermined distance,
    the reading voltage is increased if the reading voltage is smaller than the turn on window.

3. The reading method of the memory according to claim 1, wherein in the step of updating the reading voltage by moving a predetermined distance,
    the reading voltage is reduced if the reading voltage is larger than the turn on window.

4. The reading method of the memory according to claim 1, further comprising:
    showing a fail message if the step of updating the reading voltage is performed for a predetermined times and the reading voltage is still not located in the turn on window.

5. The reading method of the memory according to claim 4, wherein the predetermined distance is 200 millivolts (mV) at beginning.

6. The reading method of the memory according to claim 4, wherein the predetermined times is 3.

7. A reading method of a memory, wherein the memory has a turn on window, the reading method comprises:
    providing a reading voltage;
    showing the reading voltage if the reading voltage is located in the turn on window;
    updating the reading voltage by moving a predetermined distance if the reading voltage is not located in the turn on window; and
    changing the predetermined distance before the step of updating the reading voltage is performed again.

8. The reading method of the memory according to claim 7, wherein in the step of updating the reading voltage by moving a predetermined distance,
    the reading voltage is increased if the reading voltage is larger than the turn on window.

9. The reading method of the memory according to claim 7, wherein in the step of updating the reading voltage by moving a predetermined distance,
    the reading voltage is reduced if the reading voltage is smaller than the turn on window.

10. The reading method of the memory according to claim 7, further comprising:
    showing a fail message if the step of updating the reading voltage is performed for a predetermined times and the reading voltage is still not located in the turn on window.

11. The reading method of the memory according to claim 10, wherein the predetermined distance is 200 millivolts (mV) at beginning.

12. The reading method of the memory according to claim 11, wherein in the step of changing the predetermined distance, the predetermined distance is changed from 200 millivolts (mV) to 100 millivolts (mV).

13. The reading method of the memory according to claim 12, wherein in the step of changing the predetermined distance, the predetermined distance is changed from 100 millivolts (mV) to 50 millivolts (mV).

14. The reading method of the memory according to claim 10, wherein the predetermined times is 3.

15. The reading method of the memory according to claim 7, wherein in each step of changing the predetermined distance, the predetermined distance is changed to be small gradually.

16. The reading method of the memory according to claim 7, wherein in each step of changing the predetermined distance, the predetermined distance is changed to be small linearly.

17. The reading method of the memory according to claim 7, wherein in each step of changing the predetermined distance, the predetermined distance is changed to be small randomly.

18. The reading method of the memory according to claim 7, wherein in each step of changing the predetermined distance, the predetermined distance is changed to be large gradually.

19. The reading method of the memory according to claim 7, wherein in each step of changing the predetermined distance, the predetermined distance is changed to be large linearly.

20. The reading method of the memory according to claim 7, wherein in each step of changing the predetermined distance, the predetermined distance is changed to be small or large randomly.

\* \* \* \* \*